(12) United States Patent
Uh et al.

(10) Patent No.: US 7,879,526 B2
(45) Date of Patent: *Feb. 1, 2011

(54) HARDMASK COMPOSITIONS FOR RESIST UNDERLAYER FILMS

(75) Inventors: Dong Seon Uh, Seoul-si (KR); Chang Il Oh, Kyeonggi-Do (KR); Do Hyeon Kim, Kyeonggi-Do (KR); Hui Chan Yun, Kyeongsangnam-do (KR); Jin Kuk Lee, Kyeonggi-Do (KR); Irina Nam, Kyeonggi-do (KR); Jong Seob Kim, Daejeon-si (KR)

(73) Assignee: Cheil Industries, Inc. (KR)

( * ) Notice: Subject to any disclaimer, the term of this patent is extended or adjusted under 35 U.S.C. 154(b) by 1082 days.

This patent is subject to a terminal disclaimer.

(21) Appl. No.: 11/508,074

(22) Filed: Aug. 22, 2006

(65) Prior Publication Data

US 2007/0148974 A1    Jun. 28, 2007

(30) Foreign Application Priority Data

Dec. 26, 2005  (KR)  ............... 10-2005-0130017
Dec. 26, 2005  (KR)  ............... 10-2005-0130020

(51) Int. Cl.
  *G03F 7/09*   (2006.01)
  *G03F 7/20*   (2006.01)
  *G03F 7/30*   (2006.01)
  *G03F 7/36*   (2006.01)
  *G03C 1/825*  (2006.01)

(52) U.S. Cl. ............. 430/270.1; 430/272.1; 430/311; 430/313; 430/317; 430/319; 430/325; 430/326

(58) Field of Classification Search ............. None
See application file for complete search history.

(56) References Cited

U.S. PATENT DOCUMENTS

| | | | |
|---|---|---|---|
| 6,287,701 B1 * | 9/2001 | Oochi et al. | 428/447 |
| 6,531,260 B2 * | 3/2003 | Iwasawa et al. | 430/270.1 |
| 6,576,393 B1 * | 6/2003 | Sugita et al. | 430/270.1 |
| 6,815,137 B2 * | 11/2004 | Hoshi et al. | 430/138 |
| 2004/0209090 A1 * | 10/2004 | Iwanaga | 428/447 |
| 2007/0148586 A1 | 6/2007 | Uh et al. | |

* cited by examiner

*Primary Examiner*—Sin J. Lee
(74) *Attorney, Agent, or Firm*—Myers Bigel Sibley & Sajovec, PA

(57) ABSTRACT

Provided herein are hardmask compositions for resist underlayer films, wherein according to some embodiments of the invention, hardmask compositions include a polymer prepared by the reaction of a compound of Formula 1

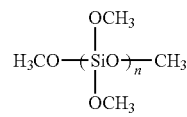

(1)

with a compound of Formula 2

$(R)_m$—Si—$(OCH_3)_{4-m}$   (2)

in the presence of a catalyst, wherein R is a monovalent organic group, n is an integer from 3 to 20, and m is 1 or 2; and an organic solvent.

Also provided herein are methods for producing a semiconductor integrated circuit device using a hardmask composition according to an embodiment of the invention. Further provided are semiconductor integrated circuit devices produced by a method embodiment of the invention.

26 Claims, No Drawings

HARDMASK COMPOSITIONS FOR RESIST UNDERLAYER FILMS

CLAIM OF PRIORITY

This application claims priority under 35 U.S.C. §119 to Korean Application Nos. 2005-0130017 and 2005-0130020, both filed on Dec. 26, 2005, the contents of which are herein incorporated by reference in their entirety.

FIELD OF THE INVENTION

The present invention relates to hardmask compositions for a resist underlayer film and to methods for the production of semiconductor integrated circuit devices using hardmask compositions.

BACKGROUND OF THE INVENTION

For better resolution in lithographic processes, an antireflective coating (ARC) material may be used to minimize the reflectivity between an imaging layer, such as a photosensitive resist layer, and a substrate. However, because the resist layer often has a composition similar that of the ARC material, the ARC material may provide poor etch selectivity relative to the imaging layer. Accordingly, since large portions of the imaging layer may be removed during etching of the ARC material after patterning, additional patterning may be required in a subsequent etching step.

However, in some lithographic imaging processes, the resist material may not provide sufficient etch resistance to effectively transfer the desired pattern to a layer underlying the resist material. In actual applications, a so-called hardmask for a resist underlayer film may be applied as an intermediate layer between a patterned resist and the substrate to be patterned. For example, when an ultrathin-film resist material is used, the substrate to be etched is thick, a substantial etching depth is required, and/or the use of a particular etchant is required for a specific substrate, a hardmask for the resist underlayer may be desirable. The hardmask for a resist underlayer film may receive the pattern from the patterned resist layer and transfer the pattern to the substrate. The hardmask for a resist underlayer film should be able to withstand the etching processes needed to transfer the pattern to the underlying material.

For example, when a substrate, such as a silicon oxide film, is processed, a resist pattern may be used as a mask. At this time, the resist may be micropatterned but with a decreased thickness. Thus, since the masking properties of the resist may be insufficient, processing of the substrate may result in damage to the substrate. Therefore, a process may be employed whereby a resist pattern is first transferred to an underlayer film for the processing of the substrate, followed by dry etching of the substrate using the underlayer film as a mask. The underlayer film for the processing of the substrate refers to a film that is formed under an antireflective film and functions as an underlayer antireflective film. In this process, the etching rate of the resist may be similar to that of the underlayer film for the processing of the substrate. Thus, it may be necessary to form a mask for processing the underlayer film between the resist and the underlayer film. As a consequence, a multilayer film consisting of the underlayer film for the processing of the substrate, the mask for processing the underlayer film and the resist may be formed on the substrate.

It is desirable that a mask for processing an underlayer film meets the following criteria: i) the mask should enable formation of a resist pattern with minimal hemming; ii) the mask should adhere well to the resist; and iii) the mask should have sufficient masking properties when the underlayer film for the processing of a substrate is processed. It is further desirable that a hardmask for processing an underlayer film exhibit high etch selectivity and be sufficiently resistant to multiple etchings. In addition, the hardmask should minimize the reflectivity between a resist and an underlying layer. Thus, the refractive index and absorbance of the mask for processing an underlayer film should be optimized to effectively utilize antireflective properties and ensure a lithographic process margin. To date, mask materials capable of meeting all these requirements have not yet been developed. Further, there has been some difficulty with the viscosity of the materials undesirably increasing due to condensation arising from the activity of acid catalysts during long-term storage.

SUMMARY OF THE INVENTION

According to some embodiments of the present invention, hardmask compositions for a resist underlayer film may include a polymer prepared by the reaction of a compound of Formula 1

with a compound of Formula 2

in the presence of a catalyst, wherein R is a monovalent organic group, n is an integer from 3 to 20, and m is 1 or 2; and an organic solvent. According to some embodiments of the present invention, the catalyst is an acid or base catalyst.

According to some embodiments of the present invention, the polymer formed by the reaction between the compound of Formula I and the compound of Formula 2, in the presence of the acid or base catalyst, may include one or more of the structures represented by Formulae 6-10

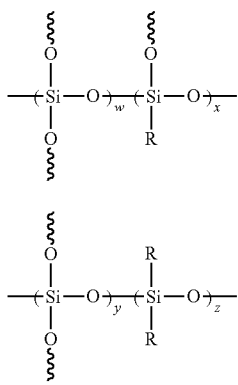

wherein R is a monovalent organic group and w, x, y and z are each positive integers.

According to some embodiments of the present invention, hardmask compositions for a resist underlayer film include a polymer including about 10 to about 99 mol %, based on the total moles of the monomeric units that include silicon, of the monomeric unit of Formula 3

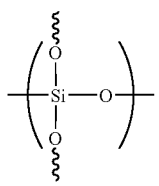

and about 1 to about 90 mol %, based on the total moles of the monomeric units that include silicon, of at least one monomeric unit selected from the monomeric units of Formulae 4 and 5 below:

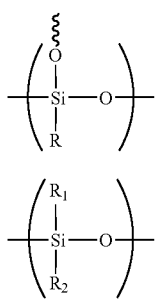

wherein R, $R_1$ and $R_2$ are each independently a monovalent organic group; and an organic solvent.

According to some embodiments of the present invention, the hardmask compositions further include an amine base.

Embodiments of the present invention further include methods for producing a semiconductor integrated circuit device, including the steps of:

(a) providing a material layer on a substrate;

(b) forming a hardmask layer on the material layer wherein the hardmask layer is composed of an organic material;

(c) forming an antireflective hardmask layer using the hardmask composition according to an embodiment of the invention for a resist underlayer film on the material layer;

(d) forming a radiation-sensitive imaging layer on the antireflective hardmask layer;

(e) patternwise exposing the imaging layer to radiation to form a pattern of radiation-exposed regions in the imaging layer;

(f) selectively removing portions of the radiation-sensitive imaging layer and the antireflective hardmask layer to expose portions of the hardmask material layer containing an organic material;

(g) selectively removing portions of the patterned antireflective hardmask layer and the hardmask material layer containing an organic material to expose portions of the material layer; and (h) etching the exposed portions of the material layer to form a patterned material layer.

According to some embodiments of the present invention, a semiconductor integrated circuit device produced by a method of an embodiment of the invention is also provided.

Therefore, the present invention has been made in view of the above problems of the prior art, and it is one of the objects of the present invention to provide novel antireflective compositions that exhibit superior long-term storage properties, are highly compatible with a photoresist, and can be effectively used in lithographic processes.

It is another object of the present invention to provide antireflective compositions that exhibit high etch selectivity, are sufficiently resistant to multiple etchings, and minimize the reflectivity between a resist and an underlying layer.

DETAILED DESCRIPTION OF EMBODIMENTS OF THE INVENTION

The invention is described more fully hereinafter. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to some embodiments of the present invention, hardmask compositions for a resist underlayer film may include a polymer prepared by the reaction of a compound of Formula 1

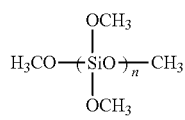

(1)

with a compound of Formula 2

$(R)_m$—Si—$(OCH_3)_{4-m}$ (2)

in the presence of a catalyst, wherein R is a monovalent organic group, n is an integer from 3 to 20, and m is 1 or 2; and an organic solvent. In some embodiments, R is an alkyl (e.g., methyl, ethyl, propyl, and the like) or aryl group (e.g., phenyl, naphthyl, anthracenyl, and the like).

In some embodiments of the present invention, the polymer may be prepared by reacting about 10 to about 90 parts by weight of the compound of Formula 1 with about 90 to about 10 parts by weight of the compound of Formula 2 in about 5 to about 70 parts by weight of the solvent, in the presence of about 0.01 to about 5 parts by weight of the acid or base catalyst, based on the total weight of the composition. The reaction may proceed via a hydrolysis or condensation reaction.

Thus, silicates of Formula 1, including, for example, MS51 ($M_w$=600) or MS56 ($M_w$=1,200) available from Mitsubishi, may be hydrolyzed and condensed with the compound of Formula 2 to prepare a polymer included in a hardmask composition according to the present invention. By controlling the silicon content in the compound of Formula 1, an optimal etch selectivity between an overlying photoresist layer and an underlying hardmask layer composed of an organic material may be achieved.

In some embodiments, the compound of Formula 2 is phenyltrimethoxysilane. By taking advantage of the fact that the phenyl group contained in the compound of Formula 2 has an absorption spectrum in the DUV region, a highly antireflective material may be provided. At the same time, by controlling the content of the phenyl and methyl groups in Formula 2, a hardmask composition having desired absorbance and refractive index at a particular wavelength may be provided.

According to some embodiments of the present invention, the polymer formed by the reaction between the compound of Formula 1 and the compound of Formula 2, in the presence of the acid or base catalyst, may include one or more of the structures represented by Formulae 6-10

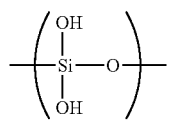

(6)

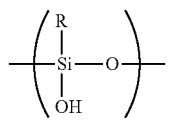

(7)

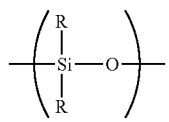

(8)

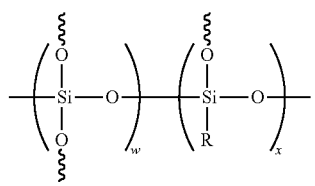

(9)

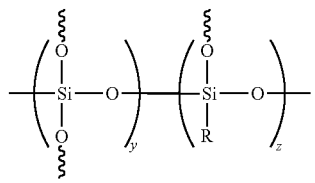

(10)

wherein R is a monovalent organic group and w, x, y and z are each positive integers.

In some embodiments, a polymer including a structure of Formula 9 includes 10-99% "w" monomeric units and 1-90% "x" monomeric units. In some embodiments, a polymer including a structure of Formula 10 includes 10-99% "y" monomeric units and 1-90% "z" monomeric units In some embodiments of the present invention, the weight ratio of the compound of Formula 1 to the compound of Formula 2 may be between about 1:9 and about 9:1. When the weight ratio is less than about 1:9, the total Si content is relatively low, which may make it difficult to achieve an optimal etch selectivity. Meanwhile, when the weight ratio is more than about 9:1, it may be difficult to achieve desirable antireflective properties.

In some embodiments of the present invention, the catalyst may be an acid or base catalyst. The hydrolysis and condensation for the synthesis of the polymer may be suitably controlled by varying the kind, the amount and the addition method of the acid or base catalyst. Examples of acid catalysts include, but are not limited to, p-toluenesulfonic acid, organic acids, p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids. Examples of base catalysts include, but are not limited to, ammonium hydroxides such as $NH_4OH$ and $N(R')_4OH$ (in which R' is a monovalent organic group). In some embodiments R' is an alkyl (e.g., methyl, ethyl, propyl, and the like) or aryl group (e.g., phenyl, naphthyl, anthracenyl, and the like).

An amine base may optionally be added to a hardmask composition according to an embodiment of the invention. The viscosity of the hardmask composition may be increased during long-term storage by condensation arising from the activity of an acid catalyst. In addition, the acidity of a hardmask layer may adversely affect the developing properties of the photoresist, causing defects such as undercuts. Both of these problems may be ameliorated by the addition of an appropriate amine base. The amine base may reduce the activity of the remaining acid catalyst during storage of the hardmask composition and inhibit changes in the molecular weight, viscosity and coating thickness of the hardmask composition, thus improving storage stability. In some embodiments, the amine base includes an aromatic amine including a pyridine ring, and in some embodiments, the amine base includes a trialkyl amine.

In some embodiments, the amine base is present in the hardmask composition in an amount in a range of about 0.01 to about 10 parts by weight, based on the total weight of the composition. If the amine base is added in an amount of less than about 0.01 parts by weight, desirably storage stability may not be achieved. However, if the amine base is added in an amount exceeding about 10 parts by weight, the amine may excessively inhibit the activity of the acid catalyst, thus impeding the crosslinking reaction. In addition, the amine may function as a base catalyst, thus adversely affecting the storage stability of the composition and/or hindering pattern formation of an overlying resist film formed from a hardmask composition according to the invention.

In some embodiments of the present invention, hardmask compositions for a resist underlayer film include a polymer including about 10 to about 99 mol %, based on the total moles of the monomeric units that include silicon, of the monomeric unit of Formula 3

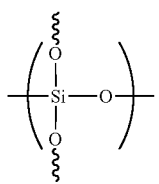

(3)

and about 1 to about 90 mol %, based on the total moles of the monomeric units that include silicon, of at least one monomeric unit selected from the monomeric units of Formulae 4 and 5 below:

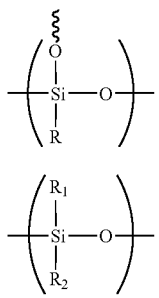

(4)

(5)

wherein R, $R_1$ and $R_2$ are each independently a monovalent organic group; and an organic solvent. In some embodiments, R, $R_1$ and $R_2$ are each independently an alkyl (e.g., methyl, ethyl, propyl, and the like) or aryl group (e.g., phenyl, naphthyl, anthracenyl, and the like). The hardmask composition may further include an amine base.

As the organic solvent used in a hardmask composition according to an embodiment of the invention, there may be used a single solvent or a mixture of two or more solvents (co-solvents). When a mixture of two or more solvents is used as the organic solvent, at least one solvent is preferably a high-boiling point solvent. The high-boiling point solvent may act to prevent formation of voids and may allow a film produced by the hardmask composition to be dried at a relatively slow rate, leading to an improvement in film flatness. As used herein, the term "high-boiling point solvent" refers to a solvent that is evaporated at a temperature lower than the coating, drying and curing temperatures of a composition according to an embodiment of the present invention.

In addition, a hardmask composition according to an embodiment of the invention further may optionally further include one or more of pyridinium p-toluenesulfonate, 2,4,4, 6-tetrabromocyclohexadienone, benzoin tosylate, 2-nitrobenzyl tosylate or alkyl esters of organic sulfonic acids. These compounds may reduce crosslinking of the polymers, and thus may improve the etch and solvent resistance of the compositions.

According to some embodiments of the present invention, the polymer may be present in the hardmask composition in an amount in a range of about 1 to about 50 parts by weight, and more preferably 1-30 parts by weight, based on the total weight of the composition.

addition, if necessary, a hardmask composition according to an embodiment of the invention may optionally include a crosslinking agent and/or a surfactant.

Embodiments of the present invention further include methods for producing a semiconductor integrated circuit device, including the steps of:

(a) providing a material layer on a substrate;

(b) forming a hardmask layer on the material layer wherein the hardmask layer is composed of an organic material;

(c) forming an antireflective hardmask layer using the hardmask composition according to an embodiment of the invention for a resist underlayer film on the material layer;

(d) forming a radiation-sensitive imaging layer on the antireflective hardmask layer;

(e) patternwise exposing the imaging layer to radiation to form a pattern of radiation-exposed regions in the imaging layer;

(f) selectively removing portions of the radiation-sensitive imaging layer and the antireflective hardmask layer to expose portions of the hardmask material layer containing an organic material;

(g) selectively removing portions of the patterned antireflective hardmask layer and the hardmask material layer containing an organic material to expose portions of the material layer; and (h) etching the exposed portions of the material layer to form a patterned material layer.

In some embodiments of the present invention, a semiconductor integrated circuit device produced by a method embodiment of the invention is provided.

The compositions and methods of the present invention may be used, for example, in the formation of patterned material layer structures, e.g., metal wiring lines, contact holes and biases, insulating sections, e.g., damascene trenches and shallow trench isolation, and trenches for capacitor structures, e.g., trenches used in the design of integrated circuit devices. The compositions and methods of the present invention may be particularly useful in the formation of patterned oxide, nitride, polysilicon and chromium oxides.

EXAMPLES

Hereinafter, the present invention will be more specifically explained with reference to the following examples. However, these examples are given for the purpose of illustration and are not to be construed as limiting the scope of the invention.

Example 1

63.6 g of methyltrimethoxysilane and 56.4 g of methylsilicate (MS-56) were dissolved in 269 g of propolyene glycol methyl ether acetate (PGMEA) in a one-liter four-neck flask equipped with a mechanical agitator, a condenser, a 1,000-ml dropping funnel and a nitrogen feed tube. The temperature of the solution was maintained at 60° C. To this solution was added a solution of 1.2 g of p-toluenesulfonic acid monohydrate in 47.4 g of ion-exchange water over one hour. After the resulting mixture was reacted at 60° C. for 4 hours, the reaction solution was allowed to cool to room temperature. 59.5 g of the PGMEA solution containing methanol was removed from the reaction solution to obtain a sample solution.

131 g of PGMEA and 70.5 g of cyclohexanone were added to 48.12 g of the sample solution to dilute the sample solution.

Example 2

A solution (0.624 g) of pyridine (10 wt %) in PGMEA was added to the diluted sample solution prepared in Example 1 to prepare a final sample solution.

Example 3

29.6 g of methyltrimethoxysilane, 3.96 g of phenyltrimethoxysilane and 26.4 g of methylsilicate (MS-56) were dissolved in 134.6 g of PGMEA in a one-liter four-neck flask equipped with a mechanical agitator, a condenser, a 1,000-ml dropping funnel and a nitrogen feed tube. The temperature of the solution was maintained at 60° C. To the solution was added a solution of 0.6 g of p-toluenesulfonic acid monohydrate in 23.2 g of ion-exchange water over one hour. After the resulting mixture was reacted at 60° C. for 4 hours, the reaction solution was allowed to cool to room temperature. 28.8 g of the PGMEA solution containing methanol was removed from the reaction solution to obtain a sample solution.

131 g of PGMEA and 70.5 g of cyclohexanone were added to 48.12 g of the sample solution to prepare a diluted sample solution.

Example 4

A solution (0.624 g) of pyridine (10 wt %) in PGMEA was added to the diluted sample solution prepared in Example 3 to prepare a final sample solution.

Example 5

48.0 g of methyltrimethoxysilane, 17.9 g of phenyltrimethoxysilane and 54.1 g of methylsilicate (MS-56) were dissolved in 269.2 g of PGMEA in a one-liter four-neck flask equipped with a mechanical agitator, a condenser, a 1,000-ml dropping funnel and a nitrogen feed tube. The temperature of the solution was maintained at 60° C. To the solution was added a solution of 1.2 g of p-toluenesulfonic acid monohydrate in 47.4 g of ion-exchange water over one hour. After the resulting mixture was reacted at 60° C. for 4 hours, the reaction solution was allowed to cool to room temperature. 47.4 g of the PGMEA solution containing methanol was removed from the reaction solution to obtain a sample solution.

130 g of PGMEA and 70.5 g of cyclohexanone were added to 49.10 g of the sample solution to prepare a diluted sample solution.

Example 6

A solution (0.624 g) of pyridine (10 wt %) in PGMEA was added to the diluted sample solution prepared in Example 5 to prepare a final sample solution.

Example 7

30.3 g of methyltrimethoxysilane, 1.5 g of propyltrimethoxysilane and 28.2 g of methylsilicate (MS-56) were dissolved in 134 g of PGMEA in a one-liter four-neck flask equipped with a mechanical agitator, a condenser, a 1,000-ml dropping funnel and a nitrogen feed tube. The temperature of the solution was maintained at 60° C. To the solution was added a solution of 0.6 g of p-toluenesulfonic acid monohydrate in 23.2 g of ion-exchange water over one hour. After the resulting mixture was reacted at 60° C. for 4 hours, the reaction solution was allowed to cool to room temperature. 31.3 g of the PGMEA solution containing methanol was removed from the reaction solution to obtain a sample solution.

132 g of PGMEA and 70.5 g of cyclohexanone were added to 47.34 g of the sample solution to prepare a diluted sample solution.

Example 8

A solution (0.624 g) of pyridine (10 wt %) in PGMEA was added to the diluted sample solution prepared in Example 7 to prepare a final sample solution.

Comparative Example 1

59.8 g of methyltrimethoxysilane and 47.9 g of tetramethoxysilane were dissolved in 359 g of PGMEA in a one-liter four-neck flask equipped with a mechanical agitator, a condenser, a 1,000-ml dropping funnel and a nitrogen feed tube. The temperature of the solution was maintained at 60° C. To the solution was added a solution of 2.5 g of maleic acid in 42 g of ion-exchange water over one hour. After the resulting mixture was reacted at 60° C. for 4 hours, the reaction solution was allowed to cool to room temperature. 136 g of PGMEA was added to the reaction solution, and then a solution (136 g) containing methanol was removed from the reaction solution using an evaporator to obtain a sample solution.

Changes in the viscosity of the sample solutions prepared in Examples 2, 4, 6 and 8 and Comparative Example 1 were measured over 28 days of storage at 40° C., and the results are shown in Table 1. Before the storage, the sample solutions were diluted to the same viscosity.

TABLE 1

| Samples used | Initial viscosity(cps) | After 7 days(cps) | After 14 days(cps) | After 28 days(cps) |
|---|---|---|---|---|
| Comparative Example 1 | 3.5 | 3.9 | 4.6 | 5.7 |
| Example 2 | 3.5 | 3.5 | 3.5 | 3.5 |
| Example 4 | 3.5 | 3.5 | 3.5 | 3.6 |
| Example 6 | 3.5 | 3.5 | 3.5 | 3.5 |
| Example 8 | 3.5 | 3.5 | 3.5 | 3.6 |

Comparative Example 2

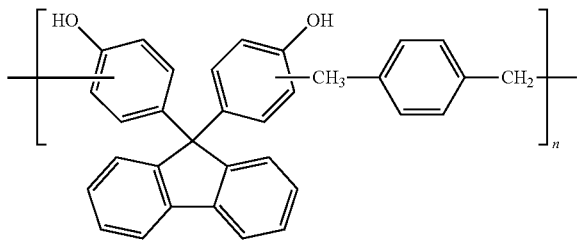

8.31 g (0.05 moles) of 1,4-bis(methoxymethyl)benzene, 0.154 g (0.001 moles) of diethyl sulfate and 200 g of γ-butyrolactone were stirred in a one-liter four-neck flask equipped with a mechanical agitator, a condenser, a 300-ml dropping funnel, and nitrogen feed tube for 10 minutes while nitrogen gas was supplied to the flask. A solution of 28.02 g (0.08 moles) of 4,4'-(9-fluorenylidene)diphenol in 200 g of γ-butyrolactone was slowly added dropwise for 30 minutes. The mixture was allowed to react for 12 hours. After completion of the reaction, the acid was removed using water, followed by concentration by an evaporator. Subsequently, the concentrate was diluted with MAK and methanol to obtain a 15 wt % solution in MAK/MeOH (4:1, w/w). The solution thus obtained was transferred to a 3-L separatory funnel, and then n-heptane was added thereto to remove low molecular weight compounds containing unreacted monomers, yielding the desired phenol resin ($M_w$=12,000, polydispersity=2.0, n=23).

0.80 g of the phenol resin, 0.2 g of an oligomeric crosslinking agent (Powderlink 1174) composed of the repeating structural unit shown below, and 2 mg of pyridinium p-toluenesulfonate were dissolved in 9 g of PGMEA, and filtered to prepare a sample solution.

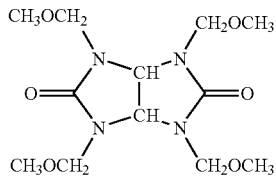

Structure of Powderlink 1174

Each of the sample solutions prepared in Examples 1, 3, 5 and 7 and Comparative Examples 1 and 2 was spin-coated onto a silicon wafer and baked at 200° C. for 60 seconds to form a 600 Å-thick film. The refractive index (n) and extinction coefficient (k) of the films were measured using an ellipsometer (J. A. Woolam). The results are shown in Table 2.

TABLE 2

| Samples used in formation of films | Optical properties (193 m) | | Optical properties (248 m) | |
|---|---|---|---|---|
| | Refractive index (n) | Extinction coefficient (k) | Refractive index (n) | Extinction coefficient (k) |
| Comparative Example 1 | 1.50 | 0.11 | 1.50 | 0.00 |
| Comparative Example 2 | 1.42 | 0.72 | 2.02 | 0.27 |
| Example 1 | 1.56 | 0.02 | 1.49 | 0.00 |
| Example 3 | 1.57 | 0.12 | 1.47 | 0.00 |
| Example 5 | 1.70 | 0.23 | 1.55 | 0.00 |
| Example 7 | 1.56 | 0.02 | 1.49 | 0.00 |

The sample solution prepared in Comparative Example 2 was spin-coated on a wafer and baked at 200° C. for 60 seconds to form a 1,500 Å-thick film. Then, each of the sample solutions prepared in Examples 1, 3, 5 and 7 and Comparative Example 1 was spin-coated on the film and baked at 200° C. for 60 seconds to form a 600 Å-thick film.

A photoresist for KrF was coated onto the film, baked at 110° C. for 60 seconds, light-exposed using an exposure system manufactured by ASML (XT:1400, NA 0.93), and developed with TMAH (a 2.38 wt % aqueous solution) to form an 90-nm line and space pattern. The 90-nm line and space pattern was observed using an FE-SEM, and the obtained results are shown in Table 3 below. Exposure latitude (EL) margin according to the changes in exposure energy and depth of focus (DoF) margin according to the changes in the distance from a light source were measured. The results are shown in Table 3.

TABLE 3

| Samples used in formation of films | Pattern Characteristics | |
|---|---|---|
| | EL margin (Δ mJ/exposure energy mJ) | DoF margin (μm) |
| Comparative Example 1 | 0.0 | 0.0 |
| Example 1 | 2 | 0.2 |
| Example 3 | 1 | 0.1 |
| Example 5 | 2 | 0.2 |
| Example 7 | 2 | 0.2 |

The patterned specimens were dry-etched using a mixed gas of $CHF_3/CF_4$, dry-etched using a mixed gas of $CHF_3/CF_4$ containing oxygen, and dry-etched using a mixed gas of $BCl_3/Cl_2$. Finally, all remaining organic materials were removed using $O_2$, and the cross section of the specimens was observed using an FE-SEM. The results are shown in Table 4.

TABLE 4

| Samples used in formation of films | Pattern shape after etching |
|---|---|
| Comparative Example 1 | Tapered |
| Example 1 | Vertical |
| Example 3 | Slightly tapered |
| Example 5 | Vertical |
| Example 7 | Slightly tapered |

A photoresist for ArF was coated onto each of the films shown in Table 3, baked at 110° C. for 60 seconds, light-exposed using an ArF exposure system (ASML1250, FN70 5.0 active, NA 0.82), and developed with TMAH (a 2.38 wt % aqueous solution) to form an 80-nm line and space pattern. The 80-nm line and space pattern was observed using an FE-SEM, and the obtained results are shown in Table 5 below. Exposure latitude (EL) margin according to the changes in exposure energy and depth of focus (DoF) margin according to the changes in the distance from a light source were measured. The results are shown in Table 5.

TABLE 5

| Samples used in formation of films | Pattern Characteristics | |
|---|---|---|
| | EL margin (Δ mJ/exposure energy mJ) | DoF margin (μm) |
| Comparative Example 1 | 0.0 | 0.0 |
| Example 1 | 1 | 0.1 |
| Example 3 | 2 | 0.2 |
| Example 5 | 2 | 0.2 |
| Example 7 | 1 | 0.1 |

The patterned specimens (Table 5) were dry-etched using a mixed gas of $CHF_3/CF_4$, dry-etched using a mixed gas of $CHF_3/CF_4$ containing oxygen, and dry-etched using a mixed gas of $CHF_3/CF_4$. Finally, all remaining organic materials were removed using $O_2$, and the cross section of the specimens was observed using an FE-SEM. The results are shown in Table 6.

TABLE 6

| Samples used in formation of films | Pattern shape after etching |
|---|---|
| Comparative Example 1 | Tapered, Coarse surface |
| Example 1 | Slightly tapered |
| Example 3 | Vertical |
| Example 5 | Vertical |
| Example 7 | Slightly tapered |

As apparent from the above description, problems due to increased viscosity due to condensation arising from the activity of an acid catalyst during long-term storage may be solved by using a hardmask composition according to an embodiment of the invention. Accordingly, the hardmask compositions according to some embodiments of the present invention may exhibit superior long-term storage properties. In addition, the hardmask compositions of some embodiments of the present invention may be highly compatible with a photoresist and may be effectively used in lithographic processes. Furthermore, the hardmask compositions of some embodiments of the present invention may improve the reproducibility of a pattern, adhere sufficiently to a resist, have superior resistance to a developing solution used after exposure of the resist, and decrease film loss upon oxygen ashing of the resist.

The invention claimed is:

1. A hardmask composition for a resist underlayer film, comprising:
   a polymer prepared by the reaction of a compound of Formula 1

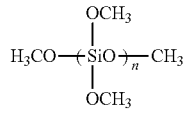

(1)

with a compound of Formula 2

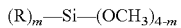

(2)

in the presence of a catalyst, wherein R is a monovalent organic group, n is an integer from 3 to 20, and m is 1 or 2;
   an amine base; and
   an organic solvent.

2. The hardmask composition according to claim 1, wherein R is an alkyl or aryl group.

3. The hardmask composition according to claim 2, wherein R is phenyl.

4. The hardmask composition according to claim 1, wherein the catalyst comprises an acid or a base catalyst.

5. The hardmask composition according to claim 4, wherein the acid catalyst is selected from one or more of the group consisting of p-toluenesulfonic acid, organic acids, p-toluenesulfonic acid monohydrate, pyridinium p-toluenesulfonate, 2,4,4,6-tetrabromocyclohexadienone, benzoin tosylate, 2-nitrobenzyl tosylate and alkyl esters of organic sulfonic acids.

6. The hardmask composition according to claim 4, wherein the base catalyst comprises one or more ammonium hydroxides of the formula $NH_4OH$ or $N(R')_4OH$, wherein R' is a monovalent organic group.

7. The hardmask composition of claim 4, wherein the catalyst is an acid catalyst.

8. The hardmask composition according to claim 4, wherein the polymer is prepared by reacting about 10 to about 90 parts by weight of the compound of Formula 1 with about 90 to about 10 parts by weight of the compound of Formula 2 in about 5 to about 70 parts by weight of the solvent, in the presence of about 0.01 to about 5 parts by weight of the acid or base catalyst, based on the total weight of the hardmask composition.

9. The hardmask composition of claim 1, wherein the amine base comprises one or more of a trialkyl amine and an aromatic amine comprising a pyridine ring.

10. The hardmask composition according to claim 1, wherein the amine base is present in an amount in a range of about 0.01 to about 10 parts by weight, based on the total weight of the composition.

11. The hardmask composition according to claim 1, wherein the polymer is present in an amount in a range of about 1 to about 50 parts by weight, based on the total weight of the composition.

12. The hardmask composition according to claim 1, further comprising one or more of a crosslinking agent and a surfactant.

13. The hardmask composition according to claim 1, further comprising one or more of the compounds selected from the group consisting of pyridinium p-toluenesulfonate, 2,4,4,6-tetrabromocyclohexadienone, benzoin tosylate, 2-nitrobenzyl tosylate and alkyl esters of organic sulfonic acids.

14. The hardmask composition according to claim 1, wherein the polymer comprises at least one structure selected from the structures represented by Formulae 6-10

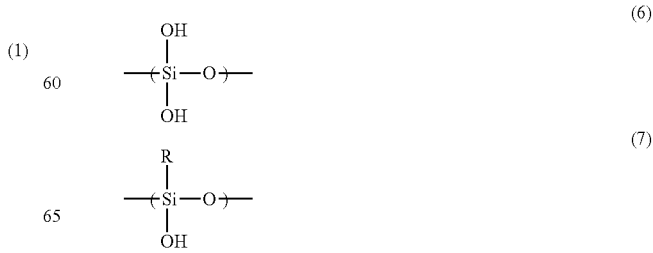

-continued

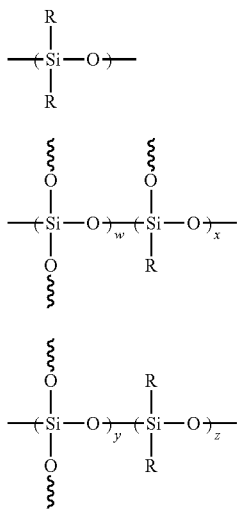

wherein R is a monovalent organic group and w, x, y and z are positive integers.

15. The hardmask composition of claim 1, wherein the polymer comprises about 10 to about 99 mol %, based on the total moles of silicon-containing monomeric units, of the monomeric unit of Formula 3 below:

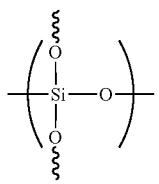

and about 1 to about 90 mol %, based on the total moles of silicon-containing monomeric units, of at least one monomeric unit selected from the monomeric units of Formulae 4 and 5 below:

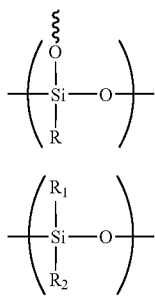

wherein R, $R_1$ and $R_2$ are each independently a monovalent organic group.

16. The hardmask composition according to claim 15, wherein R, $R_1$ and $R_2$ are each independently an alkyl or an aryl group.

17. The hardmask composition according to claim 16, wherein R, $R_1$ and $R_2$ are each a phenyl group.

18. The hardmask composition according to claim 15, wherein the amine base comprises one or more of a trialkyl amine and an aromatic amine comprising a pyridine ring.

19. The hardmask composition according to claim 15, wherein the amine base is present in an amount in a range of about 0.01 to about 10 parts by weight, based on the total weight of the composition.

20. The hardmask composition according to claim 15, further comprising one or more of a crosslinking agent and a surfactant.

21. The hardmask composition according to claim 15, wherein the polymer is present in an amount in a range of about 1 to about 50 parts by weight, based on the total weight of the composition.

22. The hardmask composition according to claim 15, further comprising one or more compound selected from the group consisting of pyridinium p-toluenesulfonate, 2,4,4,6-tetrabromocyclohexadienone, benzoin tosylate, 2-nitrobenzyl tosylate, and alkyl esters of organic sulfonic acids.

23. A method for producing a semiconductor integrated circuit device, comprising the steps of:
   (a) providing a material layer on a substrate;
   (b) forming a hardmask layer on the material layer wherein the hardmask layer is composed of an organic material;
   (c) forming an antireflective hardmask layer using the hardmask composition according to claim 15 for a resist underlayer film on the material layer;
   (d) forming a radiation-sensitive imaging layer on the antireflective hardmask layer;
   (e) patternwise exposing the imaging layer to radiation to form a pattern of radiation-exposed regions in the imaging layer;
   (f) selectively removing portions of the radiation-sensitive imaging layer and the antireflective hardmask layer to expose portions of the hardmask material layer containing an organic material;
   (g) selectively removing portions of the patterned antireflective hardmask layer and the hardmask material layer containing an organic material to expose portions of the material layer; and
   (h) etching the exposed portions of the material layer to form a patterned material layer.

24. A semiconductor integrated circuit device produced by the method according to claim 23.

25. A method for producing a semiconductor integrated circuit device, comprising the steps of:
   (a) providing a material layer on a substrate;
   (b) forming a hardmask layer on the material layer wherein the hardmask layer is composed of an organic material;
   (c) forming an antireflective hardmask layer using the hardmask composition according to claim 1 for a resist underlayer film on the material layer;
   (d) forming a radiation-sensitive imaging layer on the antireflective hardmask layer;
   (e) patternwise exposing the imaging layer to radiation to form a pattern of radiation-exposed regions in the imaging layer;
   (f) selectively removing portions of the radiation-sensitive imaging layer and the antireflective hardmask layer to expose portions of the hardmask material layer containing an organic material;
   (g) selectively removing portions of the patterned antireflective hardmask layer and the hardmask material layer containing an organic material to expose portions of the material layer; and
   (h) etching the exposed portions of the material layer to form a patterned material layer.

26. A semiconductor integrated circuit device produced by the method according to claim 25.

* * * * *

UNITED STATES PATENT AND TRADEMARK OFFICE
CERTIFICATE OF CORRECTION

PATENT NO. : 7,879,526 B2
APPLICATION NO. : 11/508074
DATED : February 1, 2011
INVENTOR(S) : Uh et al.

It is certified that error appears in the above-identified patent and that said Letters Patent is hereby corrected as shown below:

In the specifications:

Column 8, Line 23: Please correct "addition, if necessary" to read -- In addition, if necessary --

Column 11, Comparative Example 2: Please correct

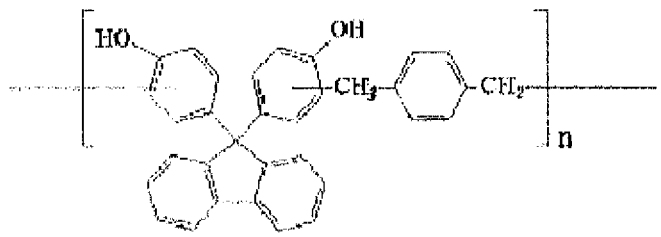

to read

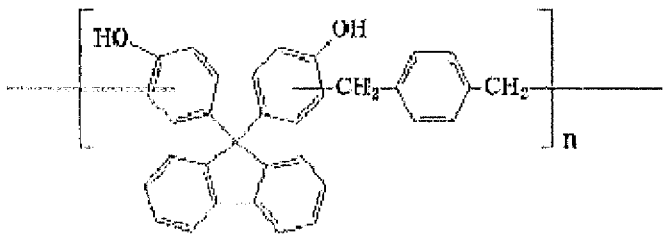

Signed and Sealed this
Eighteenth Day of October, 2011

David J. Kappos
*Director of the United States Patent and Trademark Office*